United States Patent [19]
Wong

[11] Patent Number: 5,779,751
[45] Date of Patent: Jul. 14, 1998

[54] PHOTOLITHOGRAPHIC METHOD OF FABRICATING FRESNEL LENSES

[75] Inventor: Kaiser H. Wong, Torrance, Calif.

[73] Assignee: Xerox Corporation, Stamford, Conn.

[21] Appl. No.: 815,040

[22] Filed: Mar. 14, 1997

[51] Int. Cl.$^6$ .............. G03B 17/32; G02B 3/08
[52] U.S. Cl. .............. 65/60.3; 65/60.1; 65/60.2; 427/162; 427/165; 427/272; 427/510; 264/129; 264/132; 359/742
[58] Field of Search .............. 65/23, 60.1, 60.2, 65/60.3; 427/162, 165, 272, 510; 264/129, 132; 359/742

[56] References Cited

U.S. PATENT DOCUMENTS 5,073,007  12/1991  Kedmi et al. .............. 359/565
5,218,471  6/1993  Swanson et al. .............. 359/565

*Primary Examiner*—Donald E. Czaja
*Assistant Examiner*—Sean Vincent
*Attorney, Agent, or Firm*—Nola Mae McBain

[57] ABSTRACT

A method for making a fresnel lens on a substrate by forming a plurality of annular rings. Each ring has a plurality of steps, with each step having an inner wall and an outer wall, and an upper surface. The first step is formed on the substrate, and successive steps are formed at least partially on the upper surface of the previous step such that the outer wall of each successive annular step is offset from the outer wall of the previous annular step in an outward radial direction.

12 Claims, 5 Drawing Sheets

5,779,751

PHOTOLITHOGRAPHIC METHOD OF FABRICATING FRESNEL LENSES

BACKGROUND

This invention relates generally to the photolithographic process for producing fresnel lenses and more particularly concerns a technique in which a multiple-phase fresnel lens is produced using photolithography techniques and a masking scheme to reduce mask alignment problems.

FIG. 1 shows a top view of a four stage fresnel lens 10 with two rings, fresnel ring 12 and fresnel ring 14. A fresnel lens can be constructed with more than two rings and with each ring have both more than or less than four stages. The fresnel lens 10 is shown with four stages and two rings for illustrative purposes only. The fresnel lens 10 resides on a substrate 8 and has a fresnel lens center C. FIG. 2 shows a partial cross sectional view taken through cross-section line 2—2. The fresnel lens 10 is symmetric about the fresnel lens center C; therefore, the cross section only shows one portion of the fresnel lens 10 as necessary to describe the two rings, fresnel ring 12 and fresnel ring 14.

Both the fresnel ring 12 and the fresnel ring 14 have a lowest step 16, a middle step 18, and a highest step 20. The steps are situated such that the lowest step 16 is closest to the fresnel lens center C with the step heights increasing so that the middle step 18 is adjacent to the lowest step 16 but located further away from the fresnel lens center C than the lowest step 16. The highest step 20 is adjacent to the middle step 18 but located further away from the fresnel lens center C than both the lowest step 16 and the middle step 18. This is true for both the fresnel ring 12 and the fresnel ring 14.

FIGS. 3, 4, and 5 show a prior art process sequence used to build the fresnel lens 10. Standard photolithography masking and developing techniques are used so the focus will be on the structures created in each step and not the individual details of the steps themselves. FIG. 3 shows the substrate 8 after each lowest step 16 of what will be the fresnel ring 12 and the fresnel ring 14 has been formed on it. Each lowest step 16 has a lowest step height h1, a lowest step width Wb, and is separated from the other by a lowest step separation Sb. The lowest step 16 forms a "step" with the substrate 8 and the first two phases of our four phase fresnel lens.

FIG. 4 shows the substrate 8 after each middle step 18 of what will be the fresnel ring 12 and the fresnel ring 14 has been added to the structures shown in FIG. 3. Each middle step 18 has its own middle step width Wm, middle step height h2, and is separated from its neighbor by a middle step separation Sm. The middle step width Wm of each middle step 18 is smaller than the lowest step width Wb of each lowest step 16. The middle step 18 is built wholly on the lowest step 16 and situated such that one edge of the middle step 18 is aligned with one edge of the lowest step 16 forming a straight wall on the aligned side and a step on the non-aligned side. This "step" formed by the addition of the middle step 18 on the lowest step 16 forms the third phase of our four phase fresnel lens.

FIG. 5 shows the substrate 8 after each highest step 20 of what will be the fresnel ring 12 and the fresnel ring 14 has been added to the structures shown in FIG. 4. Each highest step 20 has its own highest step width Wt, highest step height h3, and is separated from its neighbor by a highest step separation St. The highest step width Wt of each highest step 20 is smaller than the middle step width Wm of each middle step 18. The highest step 20 is built wholly on the middle step 18 and situated such that one edge of the highest step 20 is aligned with the aligned edge of the middle step 18 and the lowest step 16 forming a straight wall on the aligned side and a step on the non-aligned side. This "step" formed by the addition of the highest step 20 on the middle step 18 forms the fourth phase of our four phase fresnel lens.

The lowest step 16, middle step 18, and the highest step 20 were all formed by depositing a layer on the substrate 8 and then using conventional masking and photolithography techniques to etch or otherwise remove the unwanted portions of the layers. Several process limitations impact the feasibility of producing a fresnel lens using the above described process. These limitations are registration errors and etchability of the structures. Registration errors lead to errors in the placement of the lowest step 16, the middle step 18 and the highest step 20 relative to each other. As discussed above, the lowest step 16, the middle step 18, and the highest step 20 are all aligned on one edge to form a "wall" structure on one side. The "wall" can be misformed if the lowest step 16, the middle step 18, and the highest step 20 are not aligned correctly with each other.

Another potential area for problems is the aspect ratio, height:width, of an area to be etched. Aspect ratios of 1:1 or less are feasible, however when the aspect ratio rises above 1:1, e.g., the height of the structure is more than the width of the gap to be etched, then feasibility of the etch becomes a problem and a limiting factor. The aspect ratio would be calculated separately for the lowest step 16, the middle step 18, and the highest step 20. The aspect ratio for the lowest step 16 is lowest step height h1/lowest step separation Sb; for the middle step 18, it is middle step height h2/middle step separation Sm; and for the highest step 20, it is highest step height h3/highest step separation St. Because these numbers are generally fixed for a given material set to receive the maximum efficiency out of the fresnel lens 10, the aspect ratios cannot be simply changed by increasing the lowest step separation Sb, middle step separation Sm, and highest step separation St, or decreasing the lowest step height h1, middle step height h2, and highest step height h3 to improve manufacturability of the fresnel lens 10.

Accordingly, it is the primary aim of the invention to provide a process sequence that would reduce mask alignment errors while at the same time providing more favorable aspect ratios without changing the final dimensions of the resultant product.

Further advantages of the invention will become apparent as the following description proceeds.

SUMMARY OF THE INVENTION

Briefly stated and in accordance with the present invention, there is provided a method for making a fresnel lens on a substrate by forming a plurality of annular rings. Each ring has a plurality of steps, with each step having an inner wall and an outer wall, and an upper surface. The first step is formed on the substrate, and successive steps are formed at least partially on the upper surface of the previous step, such that the outer wall of each successive annular step is offset from the outer wall of the previous annular step in an outward radial direction.

While the present invention will be described in connection with a preferred embodiment and method of use, it will be understood that it is not intended to limit the invention to that embodiment and procedure. On the contrary, it is intended to cover all alternatives, modifications and equivalents as may be included within the spirit and scope of the invention as defined by the appended claims.

Alpha-Numeric List of Elements fresnel lens center C
offset distance d1
offset distance d2
lowest step height h1
middle step height h2
highest step height h3
lowest step separation S1
middle step separation S2
highest step separation S3
lowest step separation Sb
middle step separation Sm
highest step separation St
lowest step width W1
middle step width W2
highest step width W3
lowest step width Wb
middle step width Wm
highest step width Wt
substrate 8
fresnel lens 10
fresnel ring 12
fresnel ring 14
lowest step 16
middle step 18
highest step 20

DETAILED DESCRIPTION OF THE INVENTION

Figure 6:
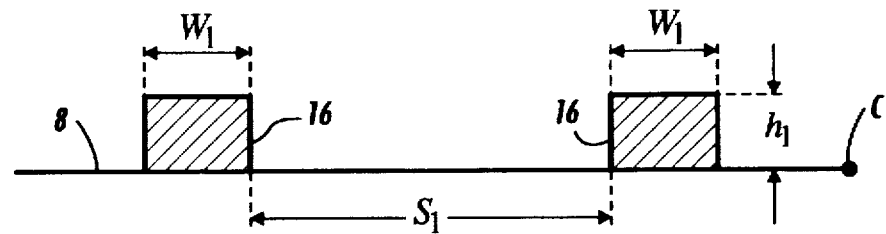
FIG. 6 is a partial cross-section view of a first step in a process to build the fresnel lens shown in FIG. 1.
Figure 7:
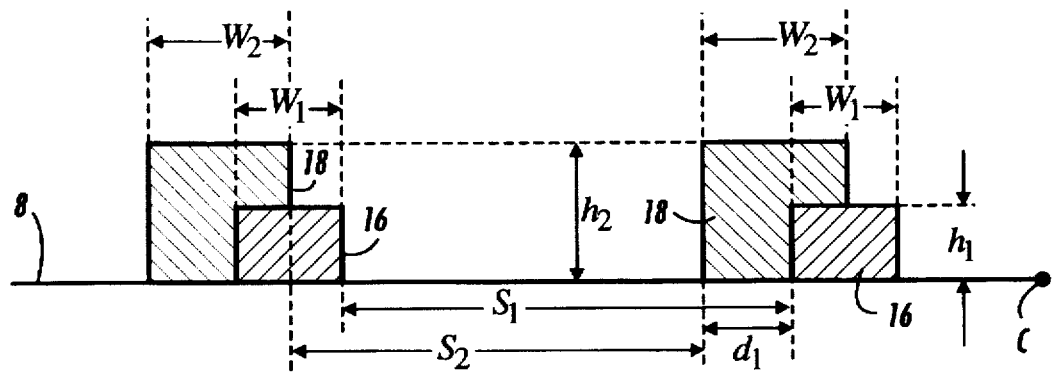
FIG. 7 is a partial cross-section view of a second step in a process to build the fresnel lens shown in FIG. 1.
Figure 8:
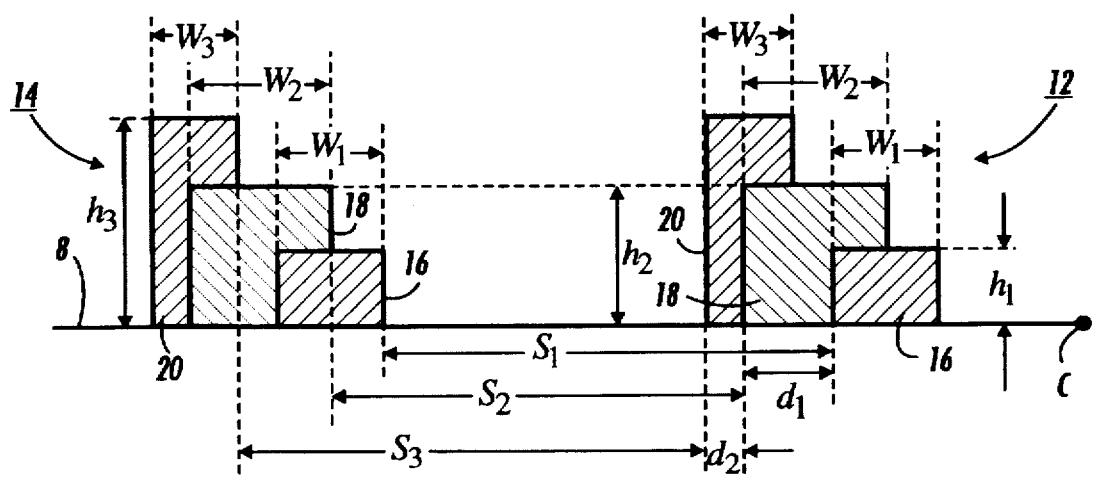
FIG. 8 is a partial cross-section view of a third step in a process to build the fresnel lens shown in FIG. 1.

Turning now to FIGS. 6, 7, and 8, a new process sequence used to build the fresnel lens 10 is shown. Standard photolithography masking and developing techniques are used so the focus will be on the structures created in each step and not the individual details of the steps themselves.

Figure 1:
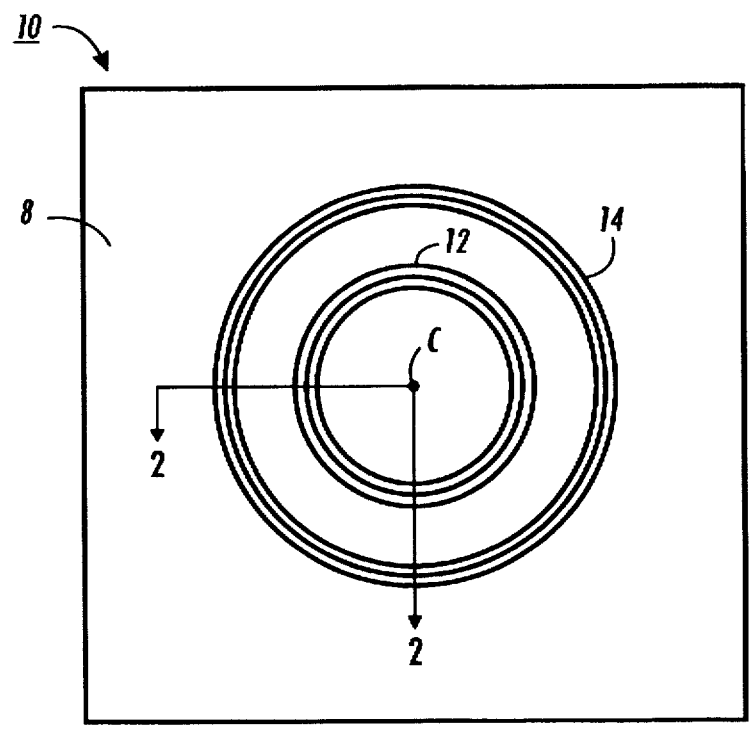
FIG. 1 is a top view of a four stage fresnel lens with two rings.
Figure 2:
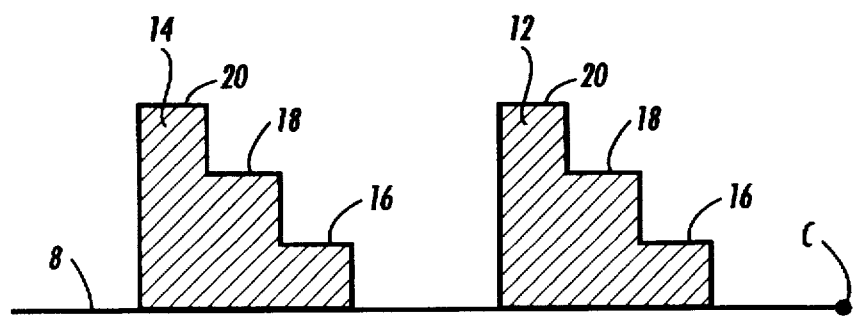
FIG. 2 is a partial cross-section view of the fresnel lens shown in FIG. 1 taken through cross-section line 2—2.
Figure 3:
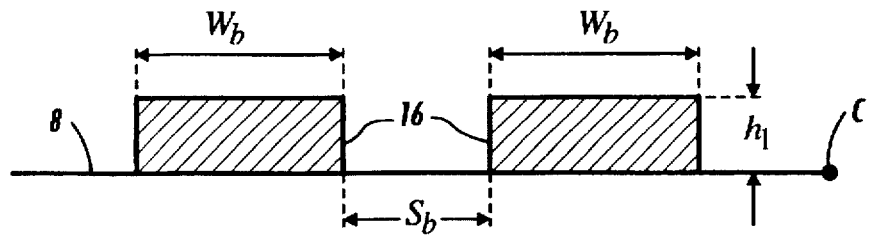
FIG. 3 is a partial cross-section view of a first step in a prior art process to build the fresnel lens shown in FIG. 1.

FIG. 6 shows the substrate 8 after each lowest step 16 of what will be the fresnel ring 12 and the fresnel ring 14 has been formed on it. Each lowest step 16 has a lowest step height h1, a lowest step width W1, and is separated from the other by a lowest step separation S1. The lowest step 16 forms a "step" with the substrate 8 and the first two phases of our four phase fresnel lens. FIG. 6 looks remarkably like FIG. 3 but some important differences must be pointed out. While the lowest step height h1 shown in both FIGS. 3 and 6 are the same, the lowest step width W1 in FIG. 6 is smaller than the lowest step width Wb shown in FIG. 3. Because the overall dimensions of the completed fresnel lens 10 shown in FIG. 1 are predetermined according to the material used to construct the fresnel lens 10, if the lowest step width W1 in FIG. 6 is smaller than the lowest step width Wb shown in FIG. 3 then the lowest step separation S1 shown in FIG. 6 must be larger than the lowest step separation Sb shown in FIG. 3.

These differences have an important impact on the manufacturability of the resultant fresnel lens 10 by shifting the aspect ratio to a more favorable number. As discussed above, aspect ratio, height:width, of an area to be etched can be a limiting factor in manufacturability. Aspect ratios of 1:1 or less are feasible; however, when the aspect ratio rises above 1:1, e.g., the height of the structure is more than the width of the gap to be etched, then feasibility of the etch becomes a problem and a limiting factor. The impact of increasing the lowest step separation S1 is to adjust the aspect ratio of the lowest step 16 to a more desirable number.

Figure 4:
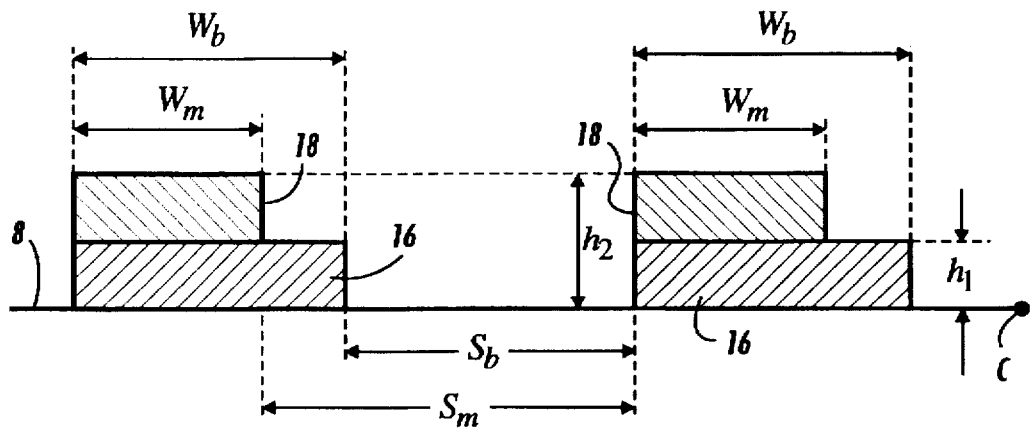
FIG. 4 is a partial cross-section view of a second step in a prior art process to build the fresnel lens shown in FIG. 1.

FIG. 7 shows the substrate 8 after each middle step 18 of what will be the fresnel ring 12 and the fresnel ring 14 have been added to the structures shown in FIG. 3. Each middle step 18 has its own middle step width W2, middle step height h2, and is separated from its neighbor by a middle step separation S2. In FIG. 4, the middle step 18 is built wholly on the lowest step 16 and situated such that one edge of the middle step 18 is aligned with one edge of the lowest step 16 forming a straight wall on the aligned side and a step on the non-aligned side. However, in FIG. 7, the middle step 18 is offset from the lowest step 16 by an offset distance d1 such that the middle step 18 forms a straight wall on one side and the middle step 18 together with the lowest step 16 forms a step on the opposing side. This "step" formed by the addition of the middle step 18 with the lowest step 16 forms the third phase of our four phase fresnel lens.

FIG. 7 looks remarkably like FIG. 4 except for the offset distance d1. This allows the lowest step width W1 in FIG. 7 to be smaller than the lowest step width Wb shown in FIG. 4. Because the overall dimensions of the completed fresnel lens 10 shown in FIG. 1 are predetermined according to the material used to construct the fresnel lens 10, if the lowest step width W1 in FIG. 7 is smaller than the lowest step width Wb shown in FIG. 4, then the lowest step separation S1 shown in FIG. 7 must be larger than the lowest step separation Sb shown in FIG. 4.

These differences have an important impact on the manufacturability of the resultant fresnel lens 10 by shifting the aspect ratio to a more favorable number. As discussed above, aspect ratio, height:width, of an area to be etched can be a limiting factor in manufacturability. Aspect ratios of 1:1 or less are feasible; however, when the aspect ratio rises above 1:1, e.g., the height of the structure is more than the width of the gap to be etched, then feasibility of the etch becomes a problem and a limiting factor. The impact of increasing the lowest step separation S1 is to adjust the aspect ratio of the lowest step 16 to a more desirable number.

Figure 5:
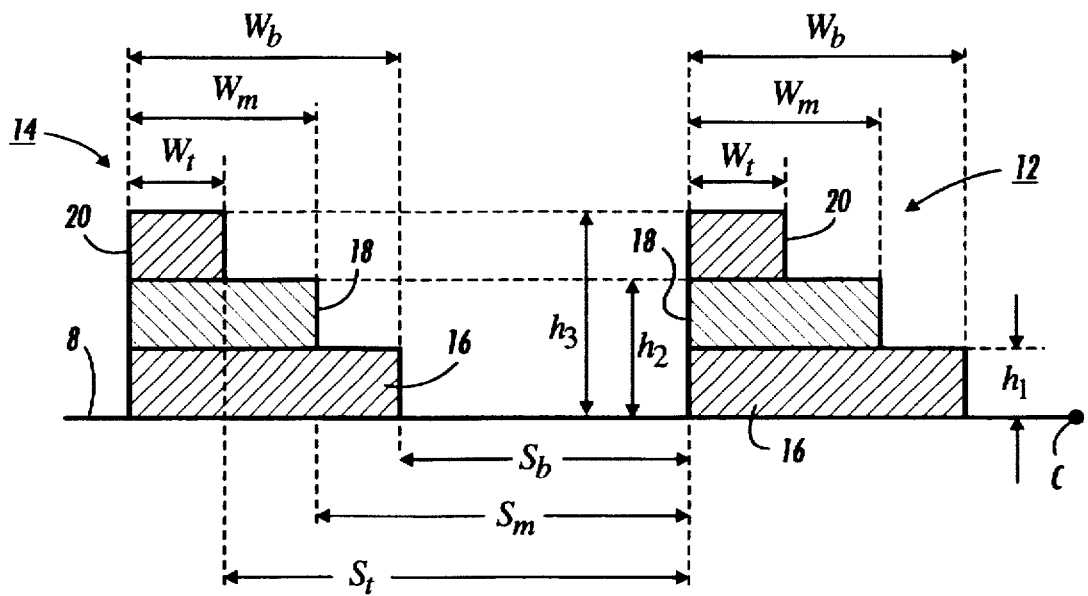
FIG. 5 is a partial cross-section view of a third step in a prior art process to build the fresnel lens shown in FIG. 1.

FIG. 8 shows the substrate 8 after each highest step 20 of what will be the fresnel ring 12 and the fresnel ring 14 have been added to the structures shown in FIG. 7. Each highest step 20 has its own highest step width W3, highest step height h3, and is separated from its neighbor by a highest step separation S3. The highest step width W3 of each highest step 20 is smaller than the middle step width Wm of each middle step 18. In FIG. 5, the highest step 20 is built wholly on the middle step 18 and situated such that one edge of the highest step 20 is aligned with the aligned edge of the middle step 18 and the lowest step 16 forming a straight wall on the aligned side and a step on the non-aligned side. In contrast, in FIG. 8 the highest step 20 is offset from the middle step 18 by an offset distance d2 such that the highest step 20 forms a straight wall on one side and the highest 20 together with the middle step 18 forms a step on the opposing side. This "step" formed by the addition of the highest step 20 with the middle step 18 forms the fourth phase of our four phase fresnel lens.

Figure 9:
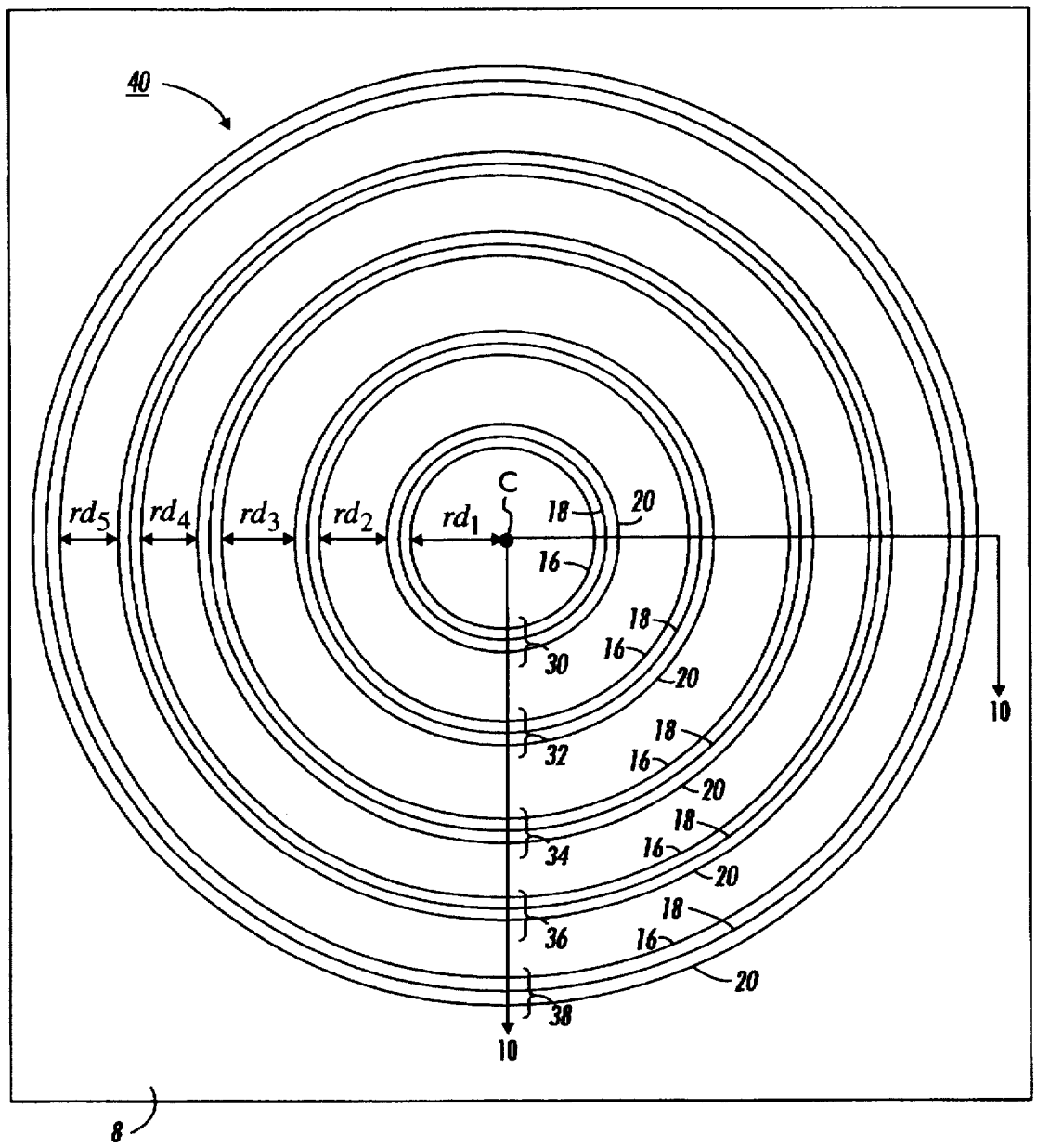
FIG. 9 is a top view of a four stage fresnel lens with five rings.
Figure 10:
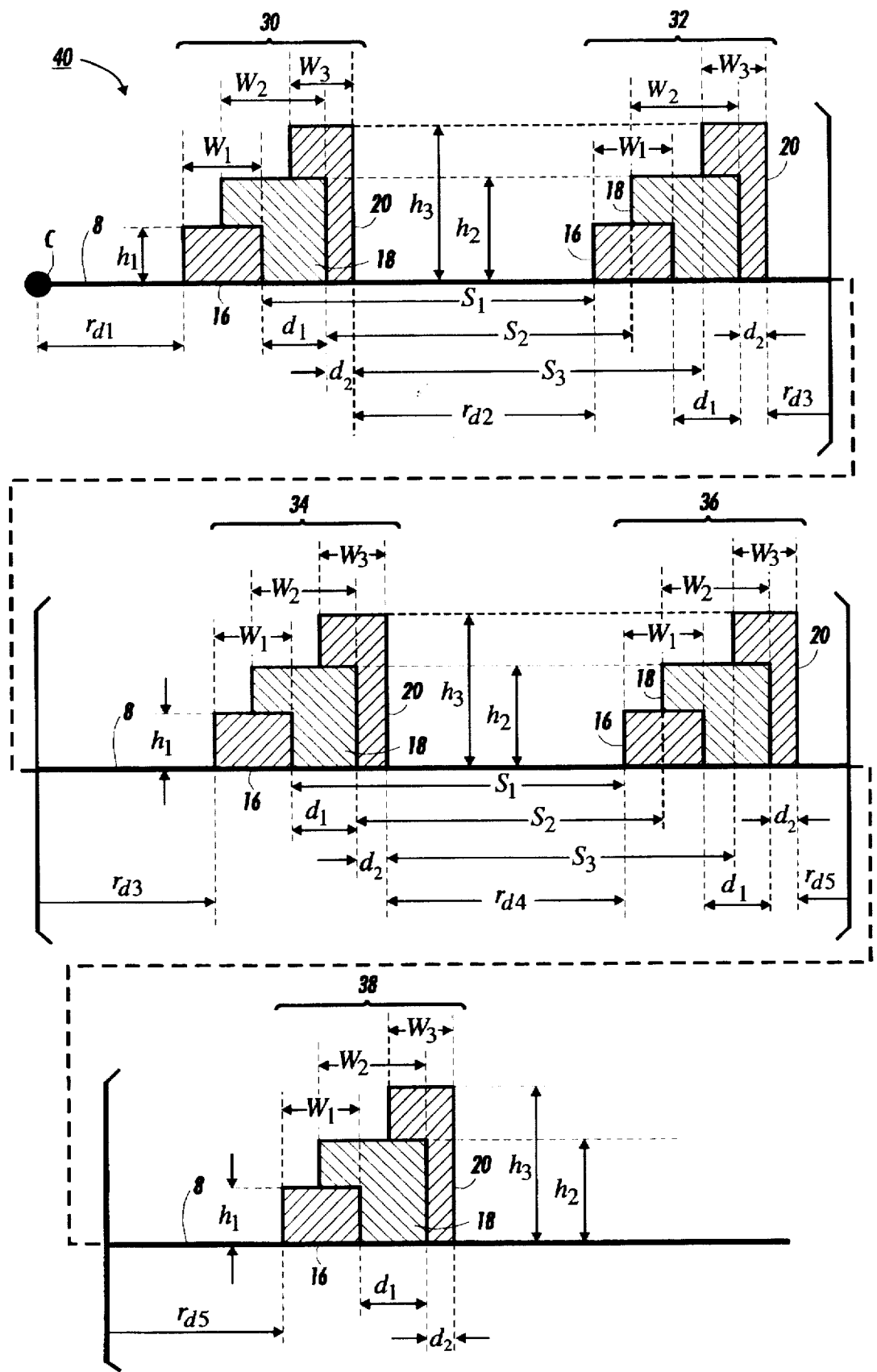
FIG. 10 is a partial cross-section view of the fresnel lens shown in FIG. 9 taken through cross-section line 10—10.

FIGS. 9 and 10 show fresnel lens 40 which is a four stage fresnel lens with fresnel ring 30, fresnel ring 32, fresnel ring 34, fresnel ring 36, fresnel ring 38 constructed of polyimide on a glass substrate 8. It should be noted that where appropriate the same reference numerals have been used to denote features that are the same as in FIGS. 1 through 8. FIG. 9 shows a planar view of the fresnel lens 40 while FIG. 10 shows a partial cross-sectional view taken through cross-section line 10—10.

As before, the fresnel rings 30, 32, 34, 36, 38 each has a lowest step 16, a middle step 18, and a highest step 20. The lowest step 16 has a lowest step width W1 and lowest step height h1; the middle step 18 has a middle step width W2 and middle step height h2; and the highest step 20 has a highest step width W3 and a highest step height h3. As before, the middle step 18 is offset from the lowest step 16 by offset distance d1 and the highest step 20 is offset from the middle step 18 by offset distance d2. The fresnel ring 30 is spaced from the fresnel lens center C of the fresnel lens 40 by radial separation distance rd1. The fresnel ring 32 is spaced from fresnel ring 30 by radial separation distance rd2. The fresnel ring 34 is spaced from fresnel ring 32 by radial separation distance rd3. The fresnel ring 36 is spaced from fresnel ring 34 by radial separation distance rd4 and the fresnel ring 38 is spaced from fresnel ring 36 by radial separation distance rd5. The distance between the lowest step 16 of one fresnel ring and the lowest step 16 of an adjacent fresnel ring is lowest step separation S1. The distance between the middle step 18 of one fresnel ring and the middle step 18 of an adjacent fresnel ring is middle step separation S2, and the distance between the highest step 20 of one fresnel ring and the highest step 20 of an adjacent fresnel ring is highest step separation S3.

It is important to note, that although all dimensions have been defined in general terms, that the actual individual dimensions for the fresnel rings 30, 32, 34, 36, 38 will differ according to the materials used and are not necessarily the same from ring to ring. For instance, the lowest step separation S1 will vary with each set of fresnel rings, becoming smaller as the rings proceed outward and becoming smallest for the outermost set of rings. The same is also true for the middle step separation S2 and the highest step separation S3.

The approximate individual dimensions for the fresnel rings 30, 32, 34, 36, 38 if they are made of polyimide on a glass substrate 8, for focussing acoustic transmission, are shown in the Table 1 below.

TABLE 1

|  | fresnel ring 30 | fresnel ring 32 | fresnel ring 34 | fresnel ring 36 | fresnel ring 38 |
|---|---|---|---|---|---|
| lowest step width w1 | 27.1μ | 15.6μ | 12.2μ | 10.6μ | 9.5μ |
| middle step width w2 | 16.8μ | 10.5μ | 8.6μ | 7.2μ | 6.1μ |
| highest step width w3 | 10.1μ | 7.0μ | 5.8μ | 5.1μ | 4.4μ |
| lowest step height h1 | 6.0μ | 6.0μ | 6.0μ | 6.0μ | 6.0μ |
| middle step height h2 | 10.0μ | 10.0μ | 10.0μ | 10.0μ | 10.0μ |
| highest step height h3 | 16.0μ | 16.0μ | 16.0μ | 16.0μ | 16.0μ |
| offset distance d1 | 5.0μ | 3.0μ | 2.6μ | 2.0μ | 1.4μ |
| offset distance d2 | 5.1μ | 4.0μ | 3.2μ | 3.1μ | 3.0μ |

The approximate separation dimensions and aspect ratios for pairs of fresnel rings 30, 32, 34, 36, 38, if they are made of polyimide on a glass substrate 8, for focusing acoustic transmission, using the method of the present invention are shown in the Table 2 below.

TABLE 2

|  | fresnel ring 30 & fresnel lens center C | fresnel ring 30 & fresnel ring 32 | fresnel ring 32 & fresnel ring 34 | fresnel ring 34 & fresnel ring 36 | fresnel ring 36 & fresnel ring 38 |
|---|---|---|---|---|---|
| lowest step separation S1 |  | 18.9μ | 13.6μ | 11.3μ | 10.0μ |
| middle step separation S2 |  | 22.0μ | 16.8μ | 14.1μ | 12.8μ |
| highest step separation S3 |  | 24.4μ | 18.8μ | 16.1μ | 14.4μ |
| aspect ratio of lowest step 16 |  | 6.0/18.9 = 0.32 | 6.0/13.6 = 0.44 | 6.0/11.3 = 0.53 | 6.0/10.0 = 0.6 |
| aspect ratio of middle step |  | 10.0/22.0 = 0.45 | 10.0/16.8 = 0.60 | 10.0/14.1 = 0.7 | 10.0/12.8 = 0.78 |

TABLE 2-continued

|  | fresnel ring 30 & fresnel lens center C | fresnel ring 30 & fresnel ring 32 | fresnel ring 32 & fresnel ring 34 | fresnel ring 34 & fresnel ring 36 | fresnel ring 36 & fresnel ring 38 |
| --- | --- | --- | --- | --- | --- |
| 18 aspect ratio of highest step 20 | | 16.0/24.4 = 0.66 | 16.0/18.8 = 0.85 | 16.0/16.1 = 0.99 | 16.0/14.4 = 1.11 |
| radial separation distance | rd1 = 36.8μ | rd2 = 8.8μ | rd3 = 6.6μ | rd4 = 5.5μ | rd5 = 4.9μ |

The approximate aspect ratios for pairs of fresnel rings 30, 32, 34, 36, 38, if they are made of polyimide on a glass substrate 8, using the more traditional method are shown in the Table 3 below.

TABLE 3

|  | fresnel ring 30 & fresnel lens center C | fresnel ring 32 & fresnel ring 32 | fresnel ring 34 & fresnel ring 36 | fresnel ring 36 & fresnel ring 38 | fresnel ring 38 & fresnel ring 36 |
| --- | --- | --- | --- | --- | --- |
| aspect ratio of lowest step 16 | | 6.0/8.8 = 0.68 | 6.0/6.6 = 0.91 | 6.0/5.5 = 1.09 | 6.0/4.9 = 1.22 |
| aspect ratio of middle step 18 | | 10.0/16.9 = 0.59 | 10.0/12.8 = 0.78 | 10.0/10.9 = 0.92 | 10.0/9.7 = 1.03 |
| aspect ratio of highest step 20 | | 16.0/24.4 = 0.66 | 16.0/18.8 = 0.85 | 16.0/16.1 = 0.99 | 16.0/14.4 = 1.11 |
| radial separation distance | rd1 = 368μ | rd2 = 8.8μ | rd3 = 6.6μ | rd4 = 5.5μ | rd5 = 4.9μ |

As can be seen by comparing the aspect ratios in Table 1 and Table 2, considerable improvement is gained in the aspect ratios of the lowest step 16, and some improvement is gained in the aspect ratios of the middle step 18 keeping these aspect ratios well within the desirable range. It should be noted that the dimensions used in this example are specific to fresnel rings 30, 32, 34, 36, 38, if they are made of polyimide on a glass substrate 8, for focusing acoustic transmission, and will vary with the specific materials used. However, independent of material, improvement in the aspect ratios can be obtained by using the method described in this application.

I claim:

1. A method for making a fresnel lens comprising:
   A) providing a substrate,
   B) forming a first annular step having an inner wall, an outer wall, and an upper surface on said substrate, and
   C) forming a second annular step having an inner wall and an outer wall at least partially on the upper surface of said first annular step such that the outer wall of said second annular step is offset from the outer wall of said first annular step in an outward radial direction.

2. A method for making a fresnel lens comprising:
   A) providing a substrate,
   B) forming a plurality of first annular steps, each step having an inner wall, an outer wall, and an upper surface on said substrate, and
   C) forming a plurality of second annular steps, each second annular step having an inner wall and an outer wall, wherein each one of the plurality of second annular steps is formed at least partially on the upper surface of one of the plurality of said first annular steps such that the outer wall of said one of the plurality of second annular steps is offset from the outer wall of said one of the plurality of said first annular steps in an outward radial direction.

3. A method for making a fresnel lens comprising:
   A) providing a substrate,
   B) forming a first annular step having an inner wall, an outer wall and an upper surface on said substrate,
   C) forming a second annular step having an inner wall, an outer wall, and an upper surface at least partially on the upper surface of said first annular step such that the outer wall of said second annular step is offset from the outer wall of said first annular step in an outward radial direction, and
   D) forming a third annular step having an inner wall and an outer wall at least partially on the upper surface of said second annular step such that the outer wall of said third annular step is offset from the outer wall of said second annular step in an outward radial direction.

4. A method for making a fresnel lens comprising:
   A) providing a substrate,
   B) forming a plurality of first annular steps, each step having an inner wall, an outer wall, and an upper surface on said substrate, C) forming a plurality of second annular steps, each second annular step having an inner wall, an outer wall, and an upper surface wherein each one of the plurality of second annular steps is formed at least partially on the upper surface of one of the plurality of said first annular steps such that the outer wall of said one of the plurality of second annular steps is offset from the outer wall of said one of the plurality of said first annular steps in an outward radial direction, and D) forming a plurality of third annular steps, each third annular step having an inner wall and an outer wall, wherein each one of the plurality of third annular steps is formed at least partially on the upper surface of one of the plurality of said second annular steps such that the outer wall of said one of the plurality of third annular steps is offset from the outer wall of said one of the plurality of said second annular steps in an outward radial direction.

5. A method for making a fresnel lens comprising:

A) providing a substrate,

B) forming a plurality of annular rings, each ring having a plurality of steps, each step having an inner wall and an outer wall, and an upper surface, each step being consecutively numbered from 1 through n inclusive wherein n is at least two and the step numbered 1 is the first step and the step numbered n is the nth step, C) wherein the first step is formed on the substrate, and D) wherein the nth step is formed at least partially on the upper surface of the n-1th step such that the outer wall of said nth annular step is offset from the outer wall of said n-1th annular step in an outward radial direction.

6. A method for making the fresnel lens of claim 5 wherein said plurality of annular rings form a plurality of concentric circles about a center point.

7. A method for making the fresnel lens of claim 5 wherein said substrate comprises glass.

8. A method for making the fresnel lens of claim 5 wherein said plurality of annular rings is comprised of polyimide.

9. A method for making a fresnel lens comprising:

A) providing a substrate,

B) forming a plurality of annular rings, each ring having a plurality of steps, each step having an inner wall and an outer wall, and an upper surface, each step being consecutively formed, C) wherein the first step is formed on the substrate, and D) wherein each successive step is formed at least partially on the upper surface of the previous step such that the outer wall of said successive step is offset from the outer wall of said previous annular step in an outward radial direction.

10. A method for making the fresnel lens of claim 9 wherein said plurality of annular rings form a plurality of concentric circles about a center point.

11. A method for making the fresnel lens of claim 9 wherein said substrate comprises glass.

12. A method for making the fresnel lens of claim 5 wherein said plurality of annular rings is comprised of polyimide.

* * * * *